United States Patent
Kühne

(10) Patent No.: US 12,310,121 B2
(45) Date of Patent: May 20, 2025

(54) BACKSHEET STACK FOR A PHOTOVOLTAIC MODULE, AND A METHOD FOR THE PRODUCTION THEREOF

(71) Applicant: HANWHA Q CELLS GMBH, Bitterfeld-Wolfen (DE)

(72) Inventor: Marcel Kühne, Bitterfeld-Wolfen (DE)

(73) Assignee: HANWHA Q CELLS GMBH, Bitterfeld-Wolfen (DE)

( * ) Notice: Subject to any disclaimer, the term of this patent is extended or adjusted under 35 U.S.C. 154(b) by 0 days.

(21) Appl. No.: 18/283,473

(22) PCT Filed: Mar. 22, 2022

(86) PCT No.: PCT/EP2022/057438
§ 371 (c)(1),
(2) Date: Sep. 22, 2023

(87) PCT Pub. No.: WO2022/200318
PCT Pub. Date: Sep. 29, 2022

(65) Prior Publication Data
US 2024/0162360 A1  May 16, 2024

(30) Foreign Application Priority Data
Mar. 23, 2021 (DE) ............ 10 2021 107 199.2

(51) Int. Cl.
*H10F 19/85* (2025.01)
*H10F 19/80* (2025.01)
*H10F 71/00* (2025.01)

(52) U.S. Cl.
CPC ........... *H10F 19/85* (2025.01); *H10F 19/804* (2025.01); *H10F 71/00* (2025.01)

(58) Field of Classification Search
CPC . H01L 31/0481; H01L 31/049; H01L 31/186; H10F 19/804; H10F 19/85
See application file for complete search history.

(56) References Cited

U.S. PATENT DOCUMENTS

| | | | |
|---|---|---|---|
| 2012/0000527 A1 | 1/2012 | Asuka | |
| 2014/0130851 A1* | 5/2014 | Osamura | B32B 25/18 136/251 |

(Continued)

FOREIGN PATENT DOCUMENTS

| | | |
|---|---|---|
| CN | 105774156 A | 7/2016 |
| DE | 10231401 A1 | 3/2013 |

(Continued)

*Primary Examiner* — Mayla Gonzalez Ramos
(74) *Attorney, Agent, or Firm* — Christensen, Fonder, Dardi & Herbert PLLC

(57) ABSTRACT

A backsheet stack for a photovoltaic module is disclosed. The photovoltaic module includes a laminate with embedded solar cells. The backsheet stack includes: an outer protective layer, an inner adhesion layer, at least one barrier layer, and at least one reinforcing layer. The outer protective layer is configured to provide protection from ultra-violet radiation. The inner adhesion layer is configured to provide adhesion to a laminate with embedded solar cells. The at least one barrier layer is formed between the outer protective layer and the inner adhesion layer and forms a sealing layer to moisture penetration. The at least one reinforcement layer is formed between the outer protective layer and the inner adhesion layer and provides mechanical stability for the backsheet stack.

14 Claims, 5 Drawing Sheets

(56) References Cited

U.S. PATENT DOCUMENTS

| | | | |
|---|---|---|---|
| 2014/0373915 A1* | 12/2014 | Saito | B32B 27/32 |
| | | | 136/256 |
| 2015/0075615 A1* | 3/2015 | Ihara | H01L 31/0481 |
| | | | 29/592 |
| 2017/0133531 A1* | 5/2017 | Isobe | B29C 55/14 |

FOREIGN PATENT DOCUMENTS

| JP | 2020032545 A | 3/2020 |
|---|---|---|
| JP | 2020191438 A | 11/2020 |
| WO | WO2009041581 A1 | 4/2009 |
| WO | WO2013105522 A1 | 7/2013 |

\* cited by examiner

BACKSHEET STACK FOR A PHOTOVOLTAIC MODULE, AND A METHOD FOR THE PRODUCTION THEREOF

PRIORITY CLAIM

The present application is a National Phase entry of PCT Application No. PCT/EP2022/057438, filed Mar. 22, 2022, which claims priority from German Patent Application No. 10 2021 107 199.2, filed Mar. 23, 2021, the disclosures of which are hereby incorporated by reference herein in their entirety.

FIELD OF THE INVENTION

The present invention relates to a backsheet stack for a photovoltaic module and a method for manufacturing the same, and more particularly to a moisture-barrier backside of a photovoltaic module.

BACKGROUND

Photovoltaic modules should reliably withstand changing weather conditions over a long period of time. For this purpose, a multilayer stack is formed on the back of a photovoltaic module.

FIG. 4 shows an example of a conventional layer stack for the back of a photovoltaic module. This layer stack includes a reinforcing layer arranged between an inner adhesion layer and an outer protective layer, the layers being bonded together with adhesive coatings. The reinforcing layer serves primarily for stability or mechanical hold, while the outer protective layer provides in particular radiation protection, e.g., against UV (ultraviolet) radiation, and the inner adhesion layer is intended to ensure reliable hold.

It has been shown that this conventional layer stack provides only inadequate protection against moisture. Over time, moisture repeatedly penetrates the module and thus damages it. This moisture can penetrate via microcracks, for example, which can occur under the influence of changing environmental influences and, in particular, intense UV radiation.

Therefore, there is a need for backside layer stacks that are able to reliably repel moisture over the long term and thus increase the lifetime of photovoltaic modules.

SUMMARY OF THE INVENTION

At least a part of the above problems is solved by a backsheet stack and a method for its manufacture, according to the independent claims. The dependent claims relate to advantageous further embodiments of the objects of the independent claims.

The present invention relates to a backsheet stack for a photovoltaic module. The photovoltaic module comprises a laminate with embedded solar cells. The backsheet stack includes: an outer protective layer, an inner adhesion layer, at least one barrier layer, and at least one reinforcing layer. The outer protective layer is configured to provide protection from ultraviolet (UV) radiation. The inner adhesion layer is configured to provide adhesion to the laminate. The at least one barrier layer is/are formed between the outer protective layer and the inner adhesion layer and forms a sealing layer for moisture penetration. The at least one reinforcing layer is/are formed between the outer protective layer and the inner adhesion layer, and provides mechanical stability to the backsheet stack.

Optionally, the at least one barrier layer is formed between the at least one reinforcing layer and the outer protective layer. The at least one barrier layer may also be formed between the at least one reinforcing layer and the inner adhesion layer. For example, the reinforcing layer may be arranged between a first barrier layer and a second barrier layer.

Optionally, the at least one reinforcing layer includes a first reinforcing layer and a second reinforcing layer, and the at least one barrier layer may be formed between the first reinforcing layer and the second reinforcing layer.

Optionally, the backsheet stack further includes a plurality of adhesive coatings configured to adhere at least two of the following layers together: the outer protective layer, the at least one barrier layer, the at least one reinforcing layer, the inner adhesion layer.

Optionally, the outer protective layer and/or the inner adhesion layer is formed as a coating (a so-called coating) directly on the at least one reinforcing layer. Optionally, the outer protective layer and/or the inner adhesion layer may also be formed as a coating on the barrier layer. It is understood that in the case of a coating, the adhesive coating may be omitted.

The functions or properties of the individual layers are ensured by the selected materials. The function of the outer protective layer is, in particular, to protect against UV radiation. Since UV radiation can feed into the layers causing them to become porous and thus no longer reliably sealing the back, it is important that the outer protective layer reliably blocks UV radiation. Accordingly, the outer protective layer optionally comprises at least one of the following materials: Polyethylene terephthalate (PET), Polyvinylidene fluoride (PVDF), Polyvinyl fluoride (PVF, Tedlar).

The function of the inner adhesion layer is, among other things, to provide reliable adhesion to the laminate with the embedded solar cells. In addition, this layer should also provide UV protection and reliably protect the other layers. Therefore, the inner adhesion layer optionally includes at least one of the following materials: polyethylene (PE), low density polyethylene (PE-LD), linear low density polyethylene (PE-LLD), polyvinylidene fluoride (PVDF), polyvinyl fluoride (PVF).

The function of the reinforcing layer is to provide mechanical support or mechanical stability. Accordingly, the at least one reinforcing layer includes polyethylene terephthalate (PET).

The at least one barrier layer serves as an intermediate insulation layer or sealing layer for moisture penetration. Optionally, therefore, the at least one barrier layer includes at least one of the following materials: polyethylene (PE), low-density polyethylene (PE-LD), linear low-density polyethylene (PE-LLD), ethylene-vinyl acetate copolymer (EVA), other polyolefins. When multiple barrier layers are formed, different materials can also be utilized for the different barrier layers. This offers the advantage that different advantages of individual materials can be utilized.

The materials mentioned are intended as examples and the invention is not intended to be limited to specific materials. As long as the functions of individual layers remain assured, other materials or a combination or composite of materials may be utilized.

Even if the layers should comprise the same material, they still generally differ from each other, e.g., to ensure the desired function. For example, according to embodiment examples, the layer thicknesses are selected as follows: the outer protective layer can comprise a minimum layer thickness of 15 μm (or of 20 μm or 30 μm). The adhesive coatings have, for example, a maximum layer thickness of 15 μm or of 20 μm and can comprise a minimum layer thickness of 3 μm (+/−1 μm or +/−2 μm). Typically, the layer thickness of one or all adhesive coatings is in a range between 3 μm and 15 μm. For example, the at least one reinforcing layer has a minimum layer thickness of 40 μm or of 50 μm or of 70 μm. However, it can also be 100 μm or thicker. The inner adhesion layer has, for example, a minimum layer thickness of 20 μm or of 30 μm or of 50 μm (if it consists of a polymer layer such as PE). If the inner adhesion layer is a coating, the minimum layer thickness can be 10 μm, for example.

For example, the at least one barrier layer has a minimum layer thickness that is (significantly) greater than the maximum layer thickness of the adhesive coating(s). For example, the at least one barrier layer can comprise a minimum layer thickness of 20 μm or of 30 μm or of 50 μm. However, the barrier layer can also be 100 μm or thicker. The layer thickness of the barrier layer can be adjusted so that the function (blocking of moisture) is achieved to the desired extent. Thus, the barrier layer is not an adhesive coating, but can be bonded to the other layers by means of an adhesive coating (on one or both sides). For example, an adhesive coating can first be applied in fluid form and then the barrier layer is placed on top of the adhesive coating (e.g., in solid form as a sheet) and both layers are firmly bonded to each other. Following this, an adhesive coating can again be applied in fluid form or liquefied before the next layer is formed.

Basically, an adhesive coating is a layer that holds adjacent layers together via an adhesive or bonding force. A barrier layer is a layer that forms a barrier and necessarily does not exert any adhesive or bonding force on adjacent layers (or is of only negligible size).

Embodiments also relate to a method of manufacturing a backsheet stack for a photovoltaic module. The photovoltaic module in turn includes a laminate having embedded solar cells. The method includes:

forming a reinforcing layer for mechanical stability of the backsheet stack;
forming a barrier layer on one side of the reinforcing layer to block moisture penetration;
forming an outer protective layer and an inner adhesion layer such that the reinforcing layer and the barrier layer are arranged between the outer protective layer and the inner adhesion layer.

The outer protective layer, in turn, serves as protection against UV radiation, and the inner adhesion layer serves to adhere to the laminate. Forming the individual layers may include bonding prefabricated layers or coating one layer with another layer.

Embodiments solve the moisture problem by providing an additional barrier layer within the backsheet stack, the material of which is selected to reliably block moisture penetration. At the same time, the layer stack is reliably protected from external environmental influences such as UV radiation. The desired moisture protection is achieved by the following effect. Moisture can penetrate materials via diffusion processes. This process runs faster or slower depending on the moisture differences (gradients) and the diffusion constants of the respective layers. Inserting the barrier layer(s) according to the invention does not change the diffusion constants of the materials of the individual layer itself. However, it does change the moisture gradient, as moisture is reliably blocked at the barrier, and thus the degree of moisture is equalizes over time at the various layers.

BRIEF DESCRIPTION OF THE DRAWINGS

Further advantages and details of the present invention will be apparent from the examples of embodiments described below and from the accompanying drawings. However, the examples given do not constitute a limitation of the invention.

DETAILED DESCRIPTION

Figure 1:
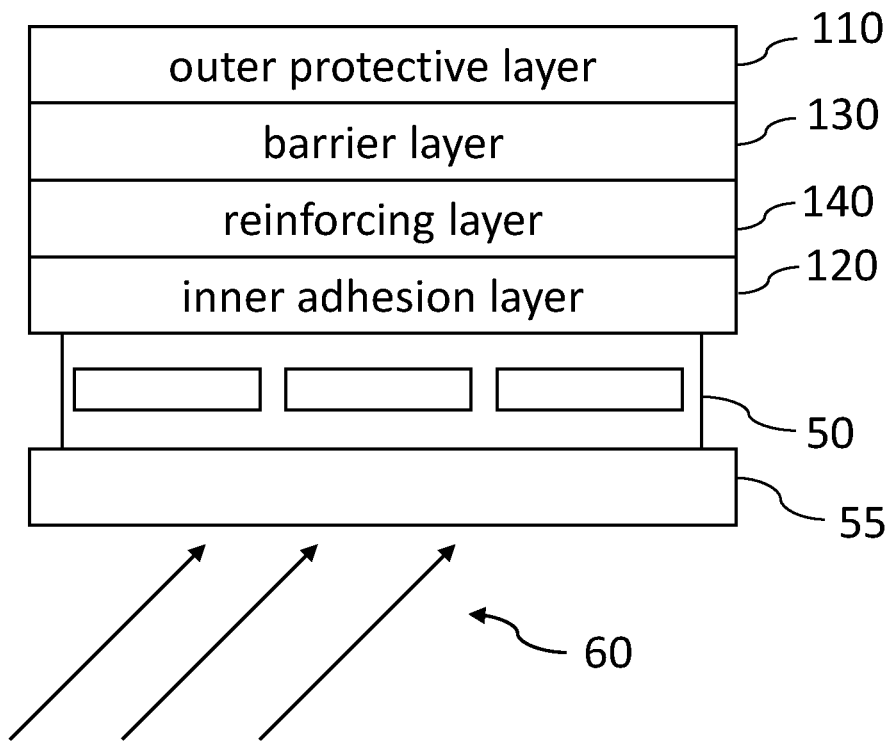
FIG. 1 shows a backsheet stack for a photovoltaic module according to an embodiment of the present invention.

FIG. 1 shows an exemplary backsheet stack according to an embodiment of the present invention. The backsheet stack is particularly suitable and configured or formed for backside stabilization and backside protection of a photovoltaic module, in which a laminate 50 with embedded solar cells is present. In this context, the rear side refers to the side facing away from a light irradiation 60 on the photovoltaic module, and the layer stack is intended in particular to protect the embedded solar cells 50 from penetrating moisture or air. On the front side (facing the solar radiation), a front side protection 60 (e.g., as glass) can be formed.

To this end, the backing layer stack includes an outer protective layer 110, an inner adhesion layer 120, at least one reinforcing layer 140, and at least one barrier layer 130. These layers have the following functions. The outer protective layer 110 is configured to provide protection from UV radiation. The inner adhesion layer 120 is configured to provide reliable adhesion to the laminate 50. The at least one reinforcing layer 140 is formed between the outer protective layer 110 and the inner adhesion layer 120 and provides mechanical stability or protection for the backing layer stack.

The at least one barrier layer 130 is formed between the outer protective layer 110 and the inner adhesion layer 120 and forms a sealing layer for moisture penetration. Thus, although it is possible for moisture from the environment to pass through the outer protective layer 110 to the barrier layer 130, it is reliably blocked there. As a result, no further moisture can penetrate through the outer protective layer 110.

Figure 2A:
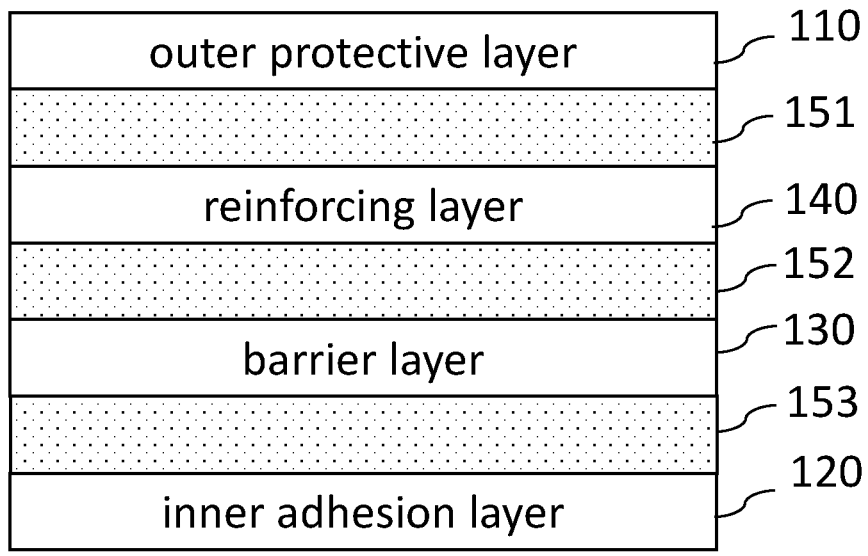
FIGS. 2A-2D show further optional layers that are part of the backsheet stack according to further embodiments.

FIG. 2A shows another embodiment in which the barrier layer 130 is formed between the reinforcing layer 140 and the inner adhesion layer 120. Furthermore, a first adhesive coating 151 is formed between the outer protective layer 110 and the reinforcing layer 140. A second adhesive coating 152 is formed between the reinforcement layer 140 and the barrier layer 130. A third adhesive coating 153 is formed between the barrier layer 130 and the inner adhesion layer 120.

It is understood that here and in the following embodiments the adhesive coatings 151, 152, . . . serve to reliably bond the individual layers and are adapted to the respective materials. In the case that the respective layers of the layer stack already adhere reliably to each other, the adhesive coatings can also be omitted.

Figure 2B:
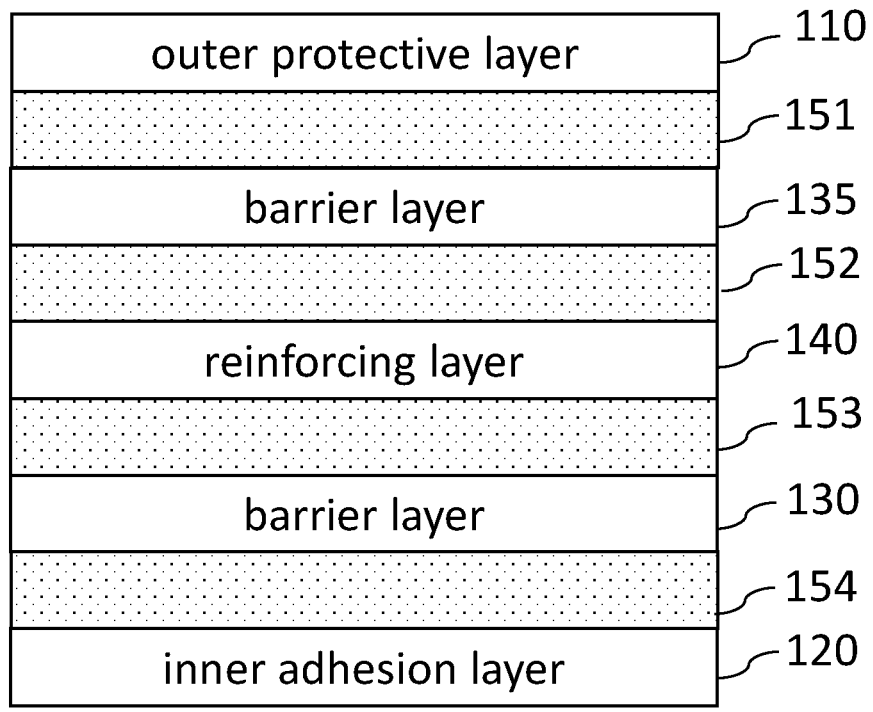

FIG. 2B shows another embodiment example for the backing layer stack, which differs from the embodiment example of FIG. 2A only in that another barrier layer 135 is formed between the reinforcing layer 140 and the outer protective layer 110. Thus, the reinforcing layer 140 is embedded on both sides between two barrier layers 130, 135 and optional adhesive coatings 152, 153. By doubling the barrier layers 130, 135, the moisture protection is significantly improved. In particular, the two barrier layers 130, 135 may also comprise different materials. For a description of the other layers also present in FIG. 1 and FIG. 2A, respectively, please refer to the description above.

Figure 2C:
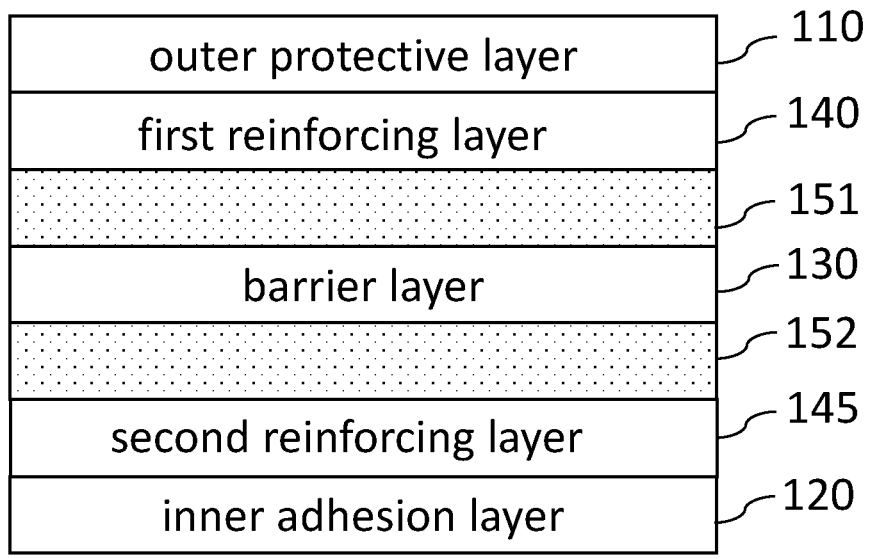

FIG. 2C shows another embodiment of the backing layer stack, which differs from the embodiment of FIG. 2A in that another, second reinforcing layer 145 is formed between the barrier layer 130 and the inner adhesion layer 120. Thus, in this embodiment, the barrier layer 130 is embedded on both sides between a first reinforcing layer 140 and a second reinforcing layer 145 and optional adhesive coatings 151, 152. By doubling the reinforcement layers 140, 145, the mechanical stability of the backsheet stack is significantly improved.

A multilayer reinforcement layer 140, 145 also offers greater fracture resistance, or a microcrack can be limited to just one layer. Here, too, different materials can be used specifically for the first and second reinforcing layers 140, 145. For a description of the other layers also present in FIG. 1 or FIG. 2A, please refer to the description above.

In the embodiment shown, the outer protective layer 110 is optionally formed as a coating on the first reinforcing layer 140. Furthermore, the inner adhesion layer 120 is optionally formed as a coating on the second reinforcing layer 140. Thus, no additional adhesive coatings are required here for bonding the outer protective layer 110 or the inner adhesion layer 120. However, these additional adhesive coatings may be present if, for example, the materials of the outer protective layer 110 and/or the inner adhesion layer 120 are not suitable as coating materials.

Figure 2D:
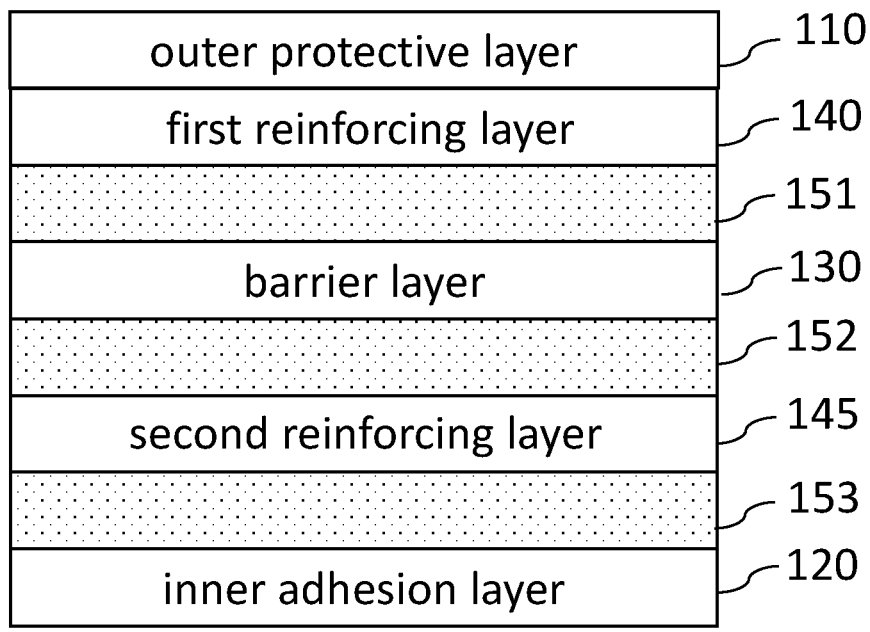

FIG. 2D shows another embodiment of the backsheet stack, which differs from the embodiment of FIG. 2C in that an optional third adhesive coating 153 is formed between the second reinforcing layer 145 and the inner adhesion layer 120. For a description of the other layers also present in FIG. 1 or FIG. 2A, please refer to the description above.

Figure 3:
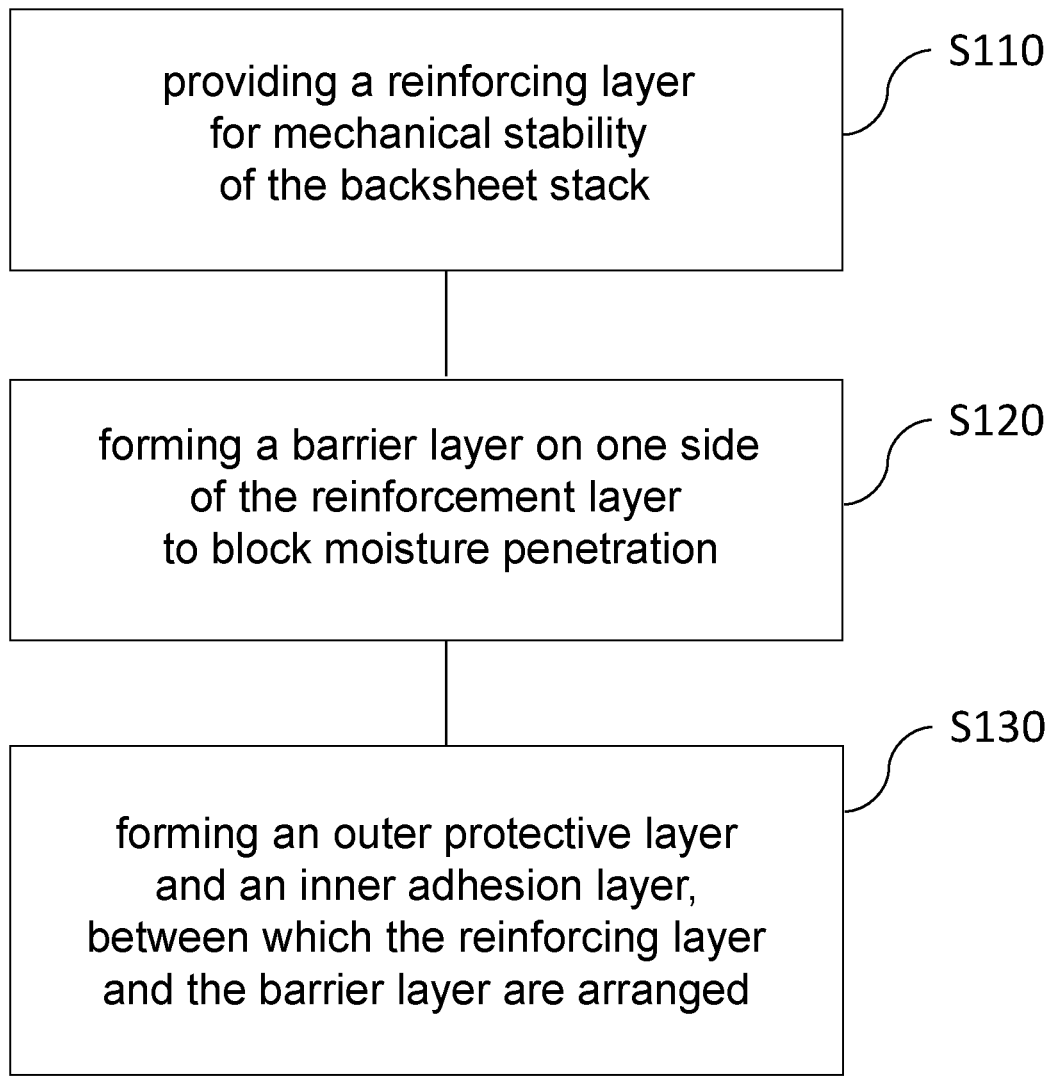
FIG. 3 shows a schematic flow diagram for a method of producing the backsheet stack.
Figure 4:
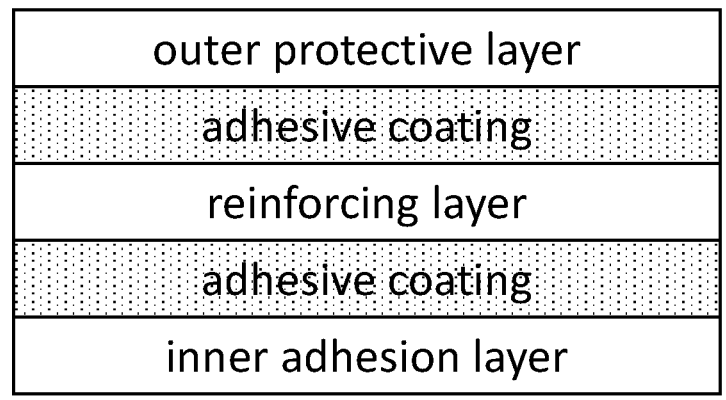
FIG. 4 shows a conventional backsheet stack.

FIG. 3 shows a flowchart for a method of manufacturing a backsheet stack for a photovoltaic module. The method includes:
- forming S110 a reinforcing layer 140, 145 for mechanical stability of the back layer stack;
- forming S120 a barrier layer 130, 135 on one side of the reinforcement layer 140, 145 to block moisture penetration;
- forming S130 an outer protective layer 110 and an inner adhesion layer 120 between which the reinforcing layer 140, 145 and the barrier layer 130, 135 are arranged, wherein the outer protective layer 110 provides protection against UV radiation or other environmental influences and the inner adhesion layer 120 provides adhesion to the laminate 50.

Optionally, forming the barrier layer 130, 135 includes depositing a solid barrier layer 130, 135 and bonding both sides of the deposited solid barrier layer 130, 135 by a liquefied adhesive material. The resulting layer thickness of the adhesive coating(s) is, for example, smaller than the layer thickness of the barrier layer 130, 135. For example, barrier layer is thicker than 20 µm and adhesive coatings 150 are in a range between 3 µm and 15 µm or maximum 20 µm thick.

Embodiments provide many advantages. For example, moisture transport through the outer protective layer 110 breaks off in a short time with saturation at the inserted barrier layer(s) 130, 135. Once sufficient moisture has penetrated, further liquid entry is reliably blocked. The limited water concentration in the barrier layer(s) is largely responsible for preventing further water diffusion. It is generally below the water concentration in the environment.

The additional barrier layer(s) introduced also has/have the effect of reducing the moisture gradient towards the interior of the module. This in turn feeds a reduction in the water diffusion rate of the entire back pile and ultimately leads to the desired blocking of the moisture flow.

The features of the invention disclosed in the description, the claims and the figures may be essential to the realization of the invention either individually or in any combination.

LIST OF REFERENCE SIGNS 50 laminate with embedded solar cells
55 front side protection
60 exemplary solar radiation
110 outer protective layer
120 inner adhesion layer
130, 135 barrier layer(s)
140, 145 reinforcing layer(s)
151, 152, . . . adhesive coatings

The invention claimed is:

1. A backsheet stack for a photovoltaic module, the photovoltaic module comprising a laminate of embedded solar cells, the backsheet stack comprising:
   an outer protective layer configured to provide protection from ultraviolet radiation;
   an inner adhesion layer configured to provide adhesion to the laminate;
   at least one barrier layer formed between the outer protective layer and the inner adhesion layer and forming a sealing layer to moisture penetration; and
   at least one reinforcing layer formed between the outer protective layer and the inner adhesion layer and providing mechanical stability to the backsheet stack;
   wherein the at least one barrier layer comprises at least one of the following materials: polyethylene, low-density polyethylene, linear low-density polyethylene, ethylene-vinyl acetate copolymer, other polyolefins.

2. The backsheet stack of claim 1, wherein the at least one barrier layer is formed:
   between the at least one reinforcing layer and the outer protective layer, and/or
   between the at least one reinforcing layer and the inner adhesion layer.

3. The backsheet stack of claim 1, wherein the at least one reinforcing layer comprises a first reinforcing layer and a second reinforcing layer, and the at least one barrier layer is formed between the first reinforcing layer and the second reinforcing layer.

4. The backsheet stack according to claim 1, further including a plurality of adhesive coatings configured to adhere at least two of the following layers together:
   the outer protective layer, the at least one barrier layer, the at least one reinforcing layer, the inner adhesion layer.

5. The backsheet stack according to claim 1, wherein the outer protective layer and/or the inner adhesion layer is formed as a coating directly on the at least one reinforcing layer.

6. The backsheet stack according to claim 1, wherein the outer protective layer comprises at least one of the following materials: polyethylene terephthalate, polyvinylidene fluoride, polyvinyl fluoride.

7. The backsheet stack according to claim 1, wherein the inner adhesion layer comprises at least one of the following materials: polyethylene, low density polyethylene, linear low density polyethylene, polyvinylidene fluoride, polyvinyl fluoride.

8. The backsheet stack according to claim 1, wherein the at least one reinforcing layer comprises polyethylene terephthalate.

9. The backsheet stack according to claim 1, wherein at least one of the following layer thicknesses is selected:
for the outer protective layer a minimum layer thickness of 15 μm,
for the at least one adhesive coating a maximum layer thickness of 15 μm,
for the at least one barrier layer a minimum layer thickness of 20 μm.

10. A method of manufacturing a backsheet stack for a photovoltaic module, the photovoltaic module including a laminate with embedded solar cells, the method comprising:
providing a reinforcing layer for mechanical stability of the backsheet stack;
forming a barrier layer on one side of the reinforcement layer to block moisture penetration;
forming an outer protective layer and an inner adhesion layer such that the reinforcing layer and the barrier layer are arranged between the outer protective layer and the inner adhesion layer, wherein the outer protective layer provides protection from ultraviolet radiation and the inner adhesion layer provides adhesion to the laminate;
wherein the at least one barrier layer comprises at least one of the following materials: polyethylene, low-density polyethylene, linear low-density polyethylene, ethylene-vinyl acetate copolymer, other polyolefins.

11. The method of claim 10, wherein at least one of the barrier layer, the outer protective layer and the inner adhesion layer is formed by bonding or coating.

12. The method of claim 11, wherein forming the barrier layer includes depositing a solid barrier layer and bonding includes bonding both sides of the deposited solid barrier layer by a liquefied adhesive material.

13. The backsheet stack of claim 4, wherein for each adhesive coating of the plurality of adhesive coatings, the adhesive coating has a minimum layer thickness of 10 μm.

14. The backsheet stack of claim 9, further comprising a plurality of adhesive coatings configured to adhere at least two of the following layers together: the outer protective layer, the at least one barrier layer, the at least one reinforcing layer, and the inner adhesion layer, and wherein for each adhesive coating of the plurality of adhesive coatings, the adhesive coating has a minimum layer thickness of 10 μm.

* * * * *